United States Patent

[11] 3,593,182

[72] Inventors Stanley Roelofs
Wheaton;
John R. Buckley, Chicago, both of, Ill.
[21] Appl. No. 816,655
[22] Filed Apr. 16, 1969
[45] Patented July 13, 1971
[73] Assignee Motorola Inc.
Franklin Park, Ill.

[54] AFC SYSTEM FOR MICROWAVE ENERGY SOURCES
7 Claims, 1 Drawing Fig.

[52] U.S. Cl. .... 331/23, 331/25
[51] Int. Cl. .... H03b 3/04
[50] Field of Search .... 331/5, 6, 9, 18, 22, 23, 25, 31

[56] References Cited
UNITED STATES PATENTS

| | | | |
|---|---|---|---|
| 2,510,095 | 6/1950 | Frankel | 331/23 |
| 3,277,390 | 10/1966 | McLin | 331/25 |
| 3,278,855 | 10/1966 | Maitland et al. | 331/22 X |

*Primary Examiner*—Roy Lake
*Assistant Examiner*—Siegfried H. Grimm
*Attorney*—Mueller & Aichele

ABSTRACT: The output of a microwave oscillator is mixed with an FM modulated crystal controlled reference frequency to develop a difference frequency. The resulting difference frequency is filtered in a low pass filter having a predetermined slope and detected. The detected modulation signal has a phase angle according to whether the output signal is greater or less than the reference signal. The detected modulation signal is compared in a phase sensitive discriminator with the reference modulation signal to develop a DC signal which is applied to the microwave oscillator to change the frequency thereof.

PATENTED JUL 13 1971 3,593,182
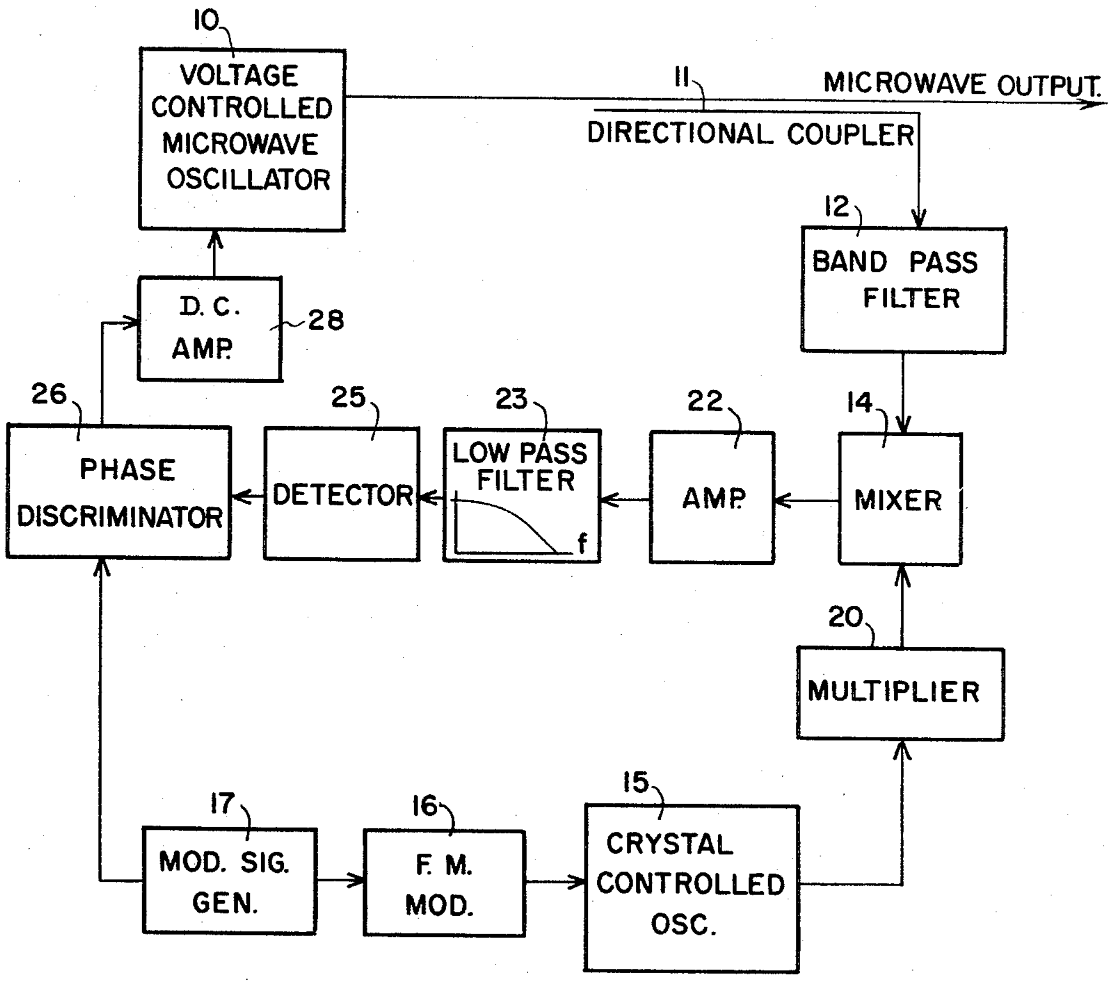
Inventors
STANLEY ROELOFS
JOHN R. BUCKLEY
BY
Mueller, Aichele & Rauner
ATTYS.

AFC SYSTEM FOR MICROWAVE ENERGY SOURCES

BACKGROUND OF THE INVENTION

At microwave frequencies it is necessary to generate the output signal by means of an oscillator which cannot easily be crystal controlled since crystals are not effective at microwave frequencies. In order to stabilize the frequency of the microwave oscillator circuits have been developed which automatically compare the output frequency with a reference frequency element which is stable.

One form of frequency reference which is used is a calibrated cavity resonator resonant at the desired frequency. The microwave signal is modulated and coupled to the cavity and the output of the cavity is detected and amplified to develop a modulation signal which is compared with the original modulation signal. The resulting DC signal is amplified and applied back to the microwave oscillator to regulate its frequency to the correct value.

In another form of an AFC system, a crystal controlled reference signal is mixed with the microwave oscillator signal to develop an IF frequency. The resulting IF frequency is compared with a second reference signal in a limiter discriminator to develop a direct current output which is again used to control the frequency of the microwave oscillator.

When using a reference cavity it is necessary to stabilize the cavity at a single reference frequency. This requires temperature compensation or placement of the cavity in an oven. Where a high degree of frequency accuracy is required, the use of cavities as the frequency has not proved to be acceptable. The use of two crystal controlled oscillators as a frequency reference produces a high degree of frequency accuracy, however, the system is expensive, uses complicated circuitry, and can lock on the wrong frequency.

SUMMARY OF THE INVENTION

It is, therefore, an object of this invention to provide an improved automatic frequency control system for a microwave oscillator.

Another object of this invention is to provide an AFC circuit for a microwave oscillator using only a single crystal controlled oscillator as a reference oscillator.

In practicing this invention a voltage controllable microwave oscillator is provided. The output signal from the microwave oscillator is sampled and mixed with an FM modulated crystal controlled reference signal to develop a difference signal. The difference signal is amplified and coupled to a detector through a low pass filter. The low pass filter has a slope which has a peak at zero frequency so that the phase of the detected FM modulation is dependent upon whether the frequency of the reference signal is greater or less than the frequency of the microwave oscillator output signal.

The detected modulation signal is compared with the reference modulation signal in a phase discriminator which produces a positive or negative DC voltage dependent upon the phase relationship between the two input signals. The output of the phase discriminator is amplified and applied to the microwave oscillator to control its frequency. When the microwave output frequency is equal to the reference frequency the difference frequency is zero and the output of the phase discriminator is also zero so that the microwave oscillator is held at this frequency.

The invention is illustrated in the single drawing, a block diagram of a microwave AFC system incorporating the features of this invention.

DETAILED DESCRIPTION OF THE INVENTION

Referring to the drawing, there is shown a voltage controlled microwave oscillator 10, which may be of the Klystron type, and which develops an output signal. A small portion of the output signal is coupled to band-pass filter 12 through directional coupler 11. The output of band-pass filter 12 is coupled to a mixer 14.

A reference signal, $1/n$ times the desired frequency of the output signal is developed by crystal controlled oscillator 15. Modulation signal generator 17 develops a modulation signal which is coupled to FM modulator 16 to modulate the crystal controlled reference signal from oscillator 15. The frequency modulated crystal controlled oscillator signal is multiplied $n$ times by multiplier 20 and the multiplied signal is also coupled to mixer 14. Since multiplier 20 will develop many harmonics of the crystal controlled reference signal, band-pass filter 12 is included to insure that the system will only lock on the desired frequency and will not lock with the wrong harmonic. More specifically, the band-pass filter 12 will substantially reject signals having frequencies $(n+1)$ and greater times the frequency of the signal from the crystal oscillator 15, and signals having frequencies $(n-1)$ and less times the frequency of the signal from the crystal oscillator.

The output of the mixer 14 is amplified in amplifier 22. Amplifier 22 may be a wide band amplifier as the pull-in range of the system requires. Thus if the system is required to pull in from 5 megacycles the amplifier 22 will have a bandwidth of from 0 to 5 megacycles.

The difference signal from mixer 14 is filtered in low pass filter 23 and detected in detector 25. Low pass filter 23 has the amplitude versus frequency characteristics shown so that the FM modulated difference signal is changed to an AM modulated difference signal. The output signal from detector 25 will be the modulation signal and its phase will be dependent upon whether the reference signal applied to mixer 14 from multiplier 20 is higher or lower in frequency than the microwave output signal. The detected modulation signal is compared with the modulation signal from generator 17 in phase discriminator 26 to develop a direct current output voltage dependent upon the phase difference between the two modulation signals. This DC signal is amplified in DC amplifier 28 and used to control the microwave oscillator 10 in a well-known manner to shift the frequency of the microwave oscillator to the desired frequency. With the frequency of the microwave output signal equal to the frequency of the reference signal from multiplier 20 the output of detector 25 is substantially zero and the frequency of the output signal from microwave oscillator 10 is held constant.

The AFC system of this invention requires only one crystal controlled oscillator and is simple in design and inexpensive to build. The microwave oscillator frequency can be referred back to a crystal controlled reference frequency and therefore can have the high degree of accuracy which can be obtained from known crystal controlled oscillator compensation techniques.

We claim:

1. An automatic frequency control system for an output oscillator which develops an output signal having a first frequency, including in combination, reference oscillator means for developing a reference signal having a second frequency and including modulator means, generation means for developing a modulation signal coupled to said modulator means, said modulator means being responsive to said modulation signal whereby said reference signal is modulated by said modulation signal, mixer means coupled to said output oscillator and said reference oscillator means and responsive to said output signal and reference signal to develop a difference signal according to the difference in frequency therebetween with said difference signal being modulated by said modulation signal, a low pass filter circuit having an input thereof coupled to said mixer means and further having an output for passing frequencies from zero to a predetermined maximum value, demodulation means coupled to said output of said low pass filter circuit for developing a demodulated signal having the same frequency as said modulation signal, phase discriminator means coupled to said generation means and said demodulation means and responsive to the phase difference between said demodulated signal and said modulation signal to develop a control signal, said phase discriminator means further being coupled to said output oscillator for applying said control signal thereto to control the frequency of said output signal.

2. The automatic frequency control system of claim 1 wherein, said reference oscillator means includes a crystal oscillator.

3. The automatic frequency control system of claim 2 wherein, said modulator means acts to FM modulate said reference signal.

4. The automatic frequency control system of claim 3 wherein, the frequency developed by said crystal oscillator is $1/n$ times said second frequency, said reference oscillator means further including frequency multiplier means for multiplying the frequency of the signal from said crystal oscillator $n$ times to develop said reference signal having said second frequency.

5. The automatic frequency control system of claim 4, and further including band-pass filter means coupling said output oscillator means to said mixer means, said band-pass filter means acting to reject signals having frequencies $(n+1)$ and greater times the frequency of said signal from said crystal oscillator, said band-pass filter further acting to reject signals having frequencies $(n-1)$ and less times the frequency of said signal from said crystal oscillator.

6. The automatic frequency control system of claim 5 wherein, said demodulator means includes low pass filter means coupled to said mixer means and detector means coupling said low pass filter means to said phase discriminator means, said low pass filter means acting to change the FM modulation of said difference signal to AM modulation for detection by said detector means.

7. An automatic frequency control system for an output oscillator which develops an output signal having a first frequency, including in combination, reference oscillator means for developing a reference signal having a second frequency and including modulator means, said reference oscillator means including a crystal oscillator and a frequency multiplier for multiplying the frequency of the crystal oscillator $n$ times to produce said reference signal of said second frequency, generation means for developing a modulation signal coupled to said modulator means, said modulator means being responsive to said modulation signal whereby said reference signal is modulated by said modulation signal, mixer means coupled to said output oscillator and said reference oscillator means and responsive to said output signal and said reference signal to develop a difference signal according to the difference in frequency therebetween, with said difference signal being modulated by said modulation signal, demodulation means coupled to said mixer means for developing a demodulated signal having the same frequency as said modulation signal, phase discriminator means coupled to said generation means and said demodulation means and responsive to the phase difference between said demodulated signal and said modulation signal to develop a control signal, said phase discriminator means further being coupled to said output oscillator for applying said control signal thereto to control the frequency of said output oscillator, and band-pass filter means coupling said output oscillator to said mixer means, said band-pass filter means acting to reject signals having frequencies $(n+1)$ and greater times the frequency of said signal from said crystal oscillator, said band-pass filter further acting to reject signals having frequencies $(n-1)$ and less times the frequency of said signal from said crystal oscillator.